(12) United States Patent
Visconti

(10) Patent No.: US 11,295,797 B1
(45) Date of Patent: Apr. 5, 2022

(54) TECHNIQUES TO MITIGATE ASYMMETRIC LONG DELAY STRESS

(71) Applicant: Micron Technology, Inc., Boise, ID (US)

(72) Inventor: Angelo Visconti, Appiano Gentile (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/103,552

(22) Filed: Nov. 24, 2020

(51) Int. Cl.
*G11C 11/22* (2006.01)

(52) U.S. Cl.
CPC ........ *G11C 11/2259* (2013.01); *G11C 11/221* (2013.01); *G11C 11/2275* (2013.01)

(58) Field of Classification Search
CPC .............. G11C 11/2259; G11C 11/221; G11C 11/2275
USPC ........................................................ 365/145
See application file for complete search history.

(56) References Cited

U.S. PATENT DOCUMENTS

2021/0020220 A1\* 1/2021 Di Vincenzo ....... G11C 11/2257

OTHER PUBLICATIONS

U.S. Appl. No. 17/004,402, by Vimercati et al., filed Aug. 27, 2020 (54 pages).

\* cited by examiner

*Primary Examiner* — Huan Hoang
(74) *Attorney, Agent, or Firm* — Holland & Hart LLP

(57) ABSTRACT

Methods, systems, and devices for techniques to mitigate asymmetric long delay stress are described. A memory device may activate a memory cell during a first phase of an access operation cycle. The memory device may write a first state or a second state to the memory cell during the first phase of the access operation cycle. The memory device may maintain the first state or the second state during a second phase of the access operation cycle after the first phase of the access operation cycle. The memory device may write, during a third phase of the access operation cycle after the second phase of the access operation cycle, the second state to the memory cell. The memory device may precharge the memory cell during the third phase of the access operation cycle based on writing the second state to the memory cell.

25 Claims, 9 Drawing Sheets

TECHNIQUES TO MITIGATE ASYMMETRIC LONG DELAY STRESS

FIELD OF TECHNOLOGY

The following relates generally to one or more systems for memory and more specifically to techniques to mitigate asymmetric long delay stress.

BACKGROUND

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
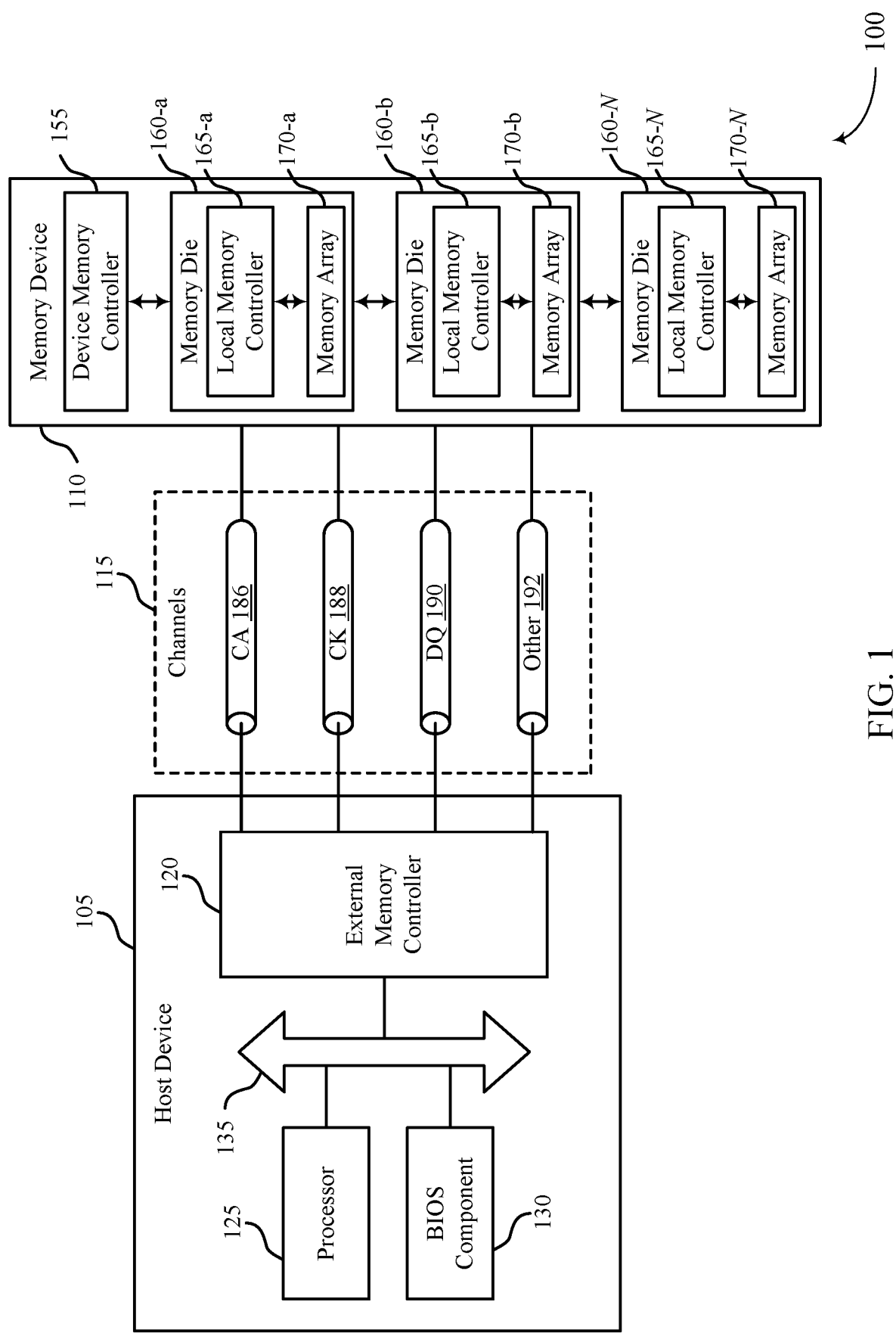
FIG. 1 illustrates an example of a system that supports techniques to mitigate asymmetric long delay stress in accordance with examples as disclosed herein.

A memory device may operate a memory cell according to a cell access operation cycle. For instance, in a first phase of the cell access operation cycle, the memory device may perform an activate operation (which may be referred to herein as an activate) on the memory cell. In a second phase of the cell access operation cycle that occurs after the first phase, the memory device may perform one or more logical operations (e.g., reading and/or writing) with the memory cell. In a third phase of the cell access operation cycle that occurs after the second phase, the memory device may perform a precharge operation (which may be referred to herein as a precharge) on the memory cell. As part of the first phase, the memory device may write a first state (e.g., may apply a voltage or current associated with a logical '1' or a logical '0') to the memory cell. As part of the second phase, the memory device may maintain the first state at the memory cell. As part of the third phase, the memory device may continue to maintain the first state or may write a second state to the memory cell.

In some examples, a memory cell may experience an asymmetric long delay (ALD) (e.g., a relatively longer delay using a voltage when reading a first state that may be stored by the memory cell compared to reading a second state that may be stored by the memory cell) when being read due at least in part on the memory device maintaining the first state at the memory cell during the second phase. For instance, if the memory device reads the cell with a voltage, such as a positive voltage, the memory cell may experience a longer delay when reading out a '0' than when reading out a '1' (e.g., ALD0). However, if the memory device reads the cell with a different voltage, such as a negative voltage, the memory cell may experience a longer delay when reading out a '1' than when reading out a '0' (i.e., ALD1). As the memory cell continues to experience stress from ALD0 and/or ALD1, the memory cell may experience increased wear-out of cell remnant polarization and, eventually, intrinsic closure of the cell read window (RW) may occur, among other disadvantages.

To mitigate the stress associated with asymmetric long delay (e.g., ALD0, ALD1), the memory device during the first phase of the access operation cycle, may write (e.g., randomly, according to a random distribution, according to some generated distribution) the first state or the second state to the memory cell. By writing (e.g., randomly) the first state or the second state or doing so according to a distribution (e.g., a random distribution, a generated distribution), the memory device may decrease times that the memory cell experiences asymmetric long delay stress. Additionally, during the third phase and before performing the precharge, the memory device may write the first state to the memory cell. Writing the first state to the memory cell before performing the precharge, may enable the memory device to perform the precharge with the memory cell in the first state but to do so with mitigated asymmetric long delay stress.

Features of the disclosure are initially described in the context of systems and dies as described with reference to FIGS. 1-2. Features of the disclosure are described in the context of an access operation cycle flowchart and access operation cycle timing diagrams as described with reference to FIGS. 3-5. These and other features of the disclosure are further illustrated by and described with reference to an apparatus diagram and flowcharts that relate to techniques to mitigate asymmetric long delay stress as described with reference to FIGS. 6-9.

FIG. 1 illustrates an example of a system 100 that supports techniques to mitigate asymmetric long delay stress in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory dies 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channels 186 may carry a read command with an address of the desired data. In some examples, a CA channel 186 may include any quantity of signal paths to decode one or more of address or command data (e.g., eight or nine signal paths).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

A memory device 110 may operate a memory cell of a memory array 170 according to a cell access operation cycle (e.g., via a device memory controller 155 and/or a local memory controller 165). For instance, in a first phase of the cell access operation cycle, the memory device 110 may perform an activate on the memory cell. In a second phase of the cell access operation cycle that occurs after the first phase, the memory device 110 may perform one or more logical operations (e.g., reading and/or writing) with the memory cell. In a third phase of the cell access operation cycle that occurs after the second phase, the memory device 110 may perform a precharge on the memory cell. As part of the first phase, the memory device 110 may write a first state (e.g., may apply a voltage or current associated with a logical '1' or a logical '0') to the memory cell. During the second phase, the memory device 110 may maintain the first state at the memory cell. During the third phase, the memory device 110 may continue to maintain the first state or may write a second state to the memory cell.

In some examples, a memory cell may experience an asymmetric long delay (ALD) when being read due at least in part on the memory device 110 maintaining the first state at the memory cell during the second phase. For instance, if the memory device 110 reads the cell with a voltage, such as a positive voltage, the memory cell may experience a longer delay when reading out a '0' than when reading out a '1' (e.g., ALD0). However, if the memory device 110 reads the cell with a different voltage, such as a negative voltage, the memory cell may experience a longer delay when reading out a '1' than when reading out a '0' (e.g., ALD1). As the memory cell continues to experience stress from ALD0 and/or ALD1, the memory cell may experience increased wear-out of cell remnant polarization and, eventually, intrinsic closure of the cell read window (RW) may occur, among other disadvantages.

To mitigate the stress associated with ALD0 and/or ALD1, the memory device 110 during the first phase of the access operation cycle, may write (e.g., randomly, according to a random distribution, according to a generated distribution) the first state or the second state to the memory cell. For instance, the memory device may include a generator (e.g., a random generator) that is configured to generate one of the first state or the second state (e.g., randomly, according to a random distribution, according to a generated distribution). By writing the first state or the second state or doing so according to a distribution (e.g., randomly, using a random distribution, using a generated distribution), the memory device 110 may decrease the times that the memory cell experiences ALD0 and/or ALD1 stress. Additionally, during the third phase and before performing the precharge, the memory device 110 may write the first state to the memory cell. Writing the first state to the memory cell before performing the precharge, may enable the memory device 110 to still perform the precharge with the memory cell in the first state but to do so with mitigated ALD stress. In some examples, the methods as described herein may also apply to a resistive-based array and/or an ferroelectric field-effect transistor (FeFET)-based array, among other implementations.

Figure 2:
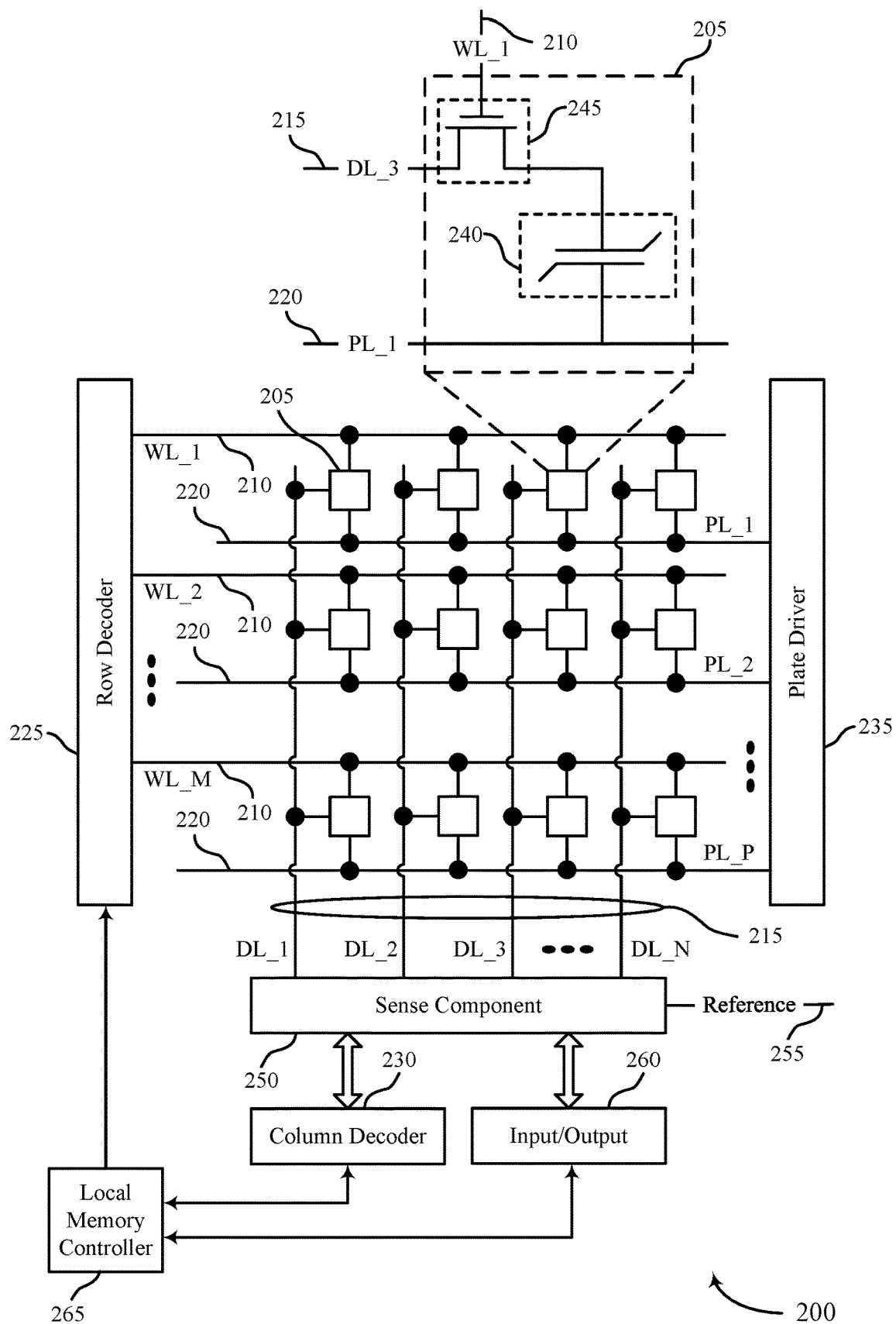
FIG. 2 illustrates an example of a memory die that supports techniques to mitigate asymmetric long delay stress in accordance with examples as disclosed herein.

FIG. 2 illustrates an example of a memory die 200 that supports techniques to mitigate asymmetric long delay stress in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the capacitor 240 of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205.

When a memory cell 205 is cycled in a distributed manner and waits on a same state between performing an activate and performing a precharge, a memory device (e.g., the memory die including memory die 200) may have a failure mechanism which is turned on. Such an example, in which cell cycling is distributed in time together with the memory cell 205 and the memory cell 205 waits on the same state between performing the activate and the precharge, may be referred to as distributed cycling. In some examples, during distributed cycling, a memory device may perform a random flip on precharge (FOP), which may prevent this condition (e.g., the cell waiting on the same state between performing the activate and performing the precharge) from occurring or may mitigate the amount of times that it occurs.

However, in some examples, if the memory device performs continuous open page access, in which the memory cell 205 waits in the status applied during the activate (e.g., a logical '1' or '0', as a function of the read quadrant). Such a cycling mode may be referred to ALD on 1 (e.g., ALD1) or ALD on 0 (e.g., ALD0). The delay on 1 or 0 may be caused at least in part based on reading the memory cell through a sense amplifier (e.g., a 2pr sense amplifier). For instance, ALD0 stress may occur when reading with a positive voltage (e.g., in a first read quadrant for the memory cell) and ALD1 stress may occur when reading with a negative voltage (e.g., in a third quadrant for the memory cell). Generally, ALD may cause an enhanced wear-out of the cell remnant polarization (e.g., as compared to fast-cycling induced wear-out for a same quantity of cycles) which may lead to an intrinsic closure of the cell RW. Due at least in part to this intrinsic behavior, using an error-correcting code (ECC), among other techniques, may not mitigate this closure of the RW. Read margins may be used to keep the RW open to avoid read fails.

The techniques as described herein may be used to avoid and/or mitigate systematic ALD0 and/or ALD1 cell stress during a continuous open page access. For instance, a random write back may be used at the end of an activate to ensure that a memory cell 205 spends the open page time (e.g., the time between performing an activate and a precharge) alternating between two levels (e.g., a first level associated with a logical '1' and a second level associated with a logical '0'). Additionally, the memory device may perform a write operation before performing the precharge to ensure that one level is written at the memory cell at a time. Such techniques may reduce the cell wear-out during continuous open page time and/or may improve the cell time to fail during continuous open page time. Additionally or alternatively, such techniques may resolve (e.g., remove) the ALD1 and/or ALD0 failure mechanism without impacting or impacting less the access time (e.g., a row address to column address delay, which may be referred to as tRCD).

Figure 3:
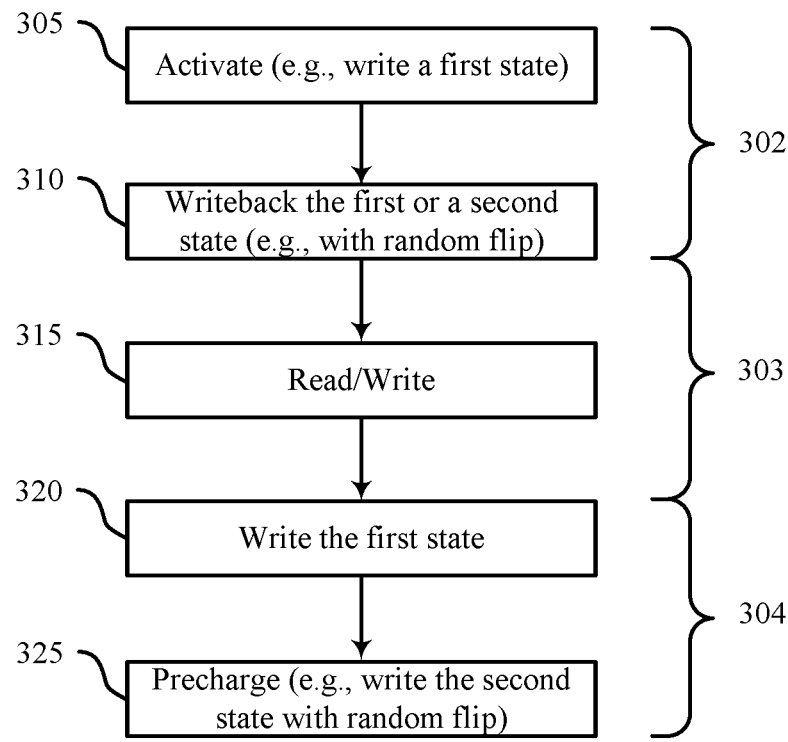
FIG. 3 illustrates an example of an access operation cycle flowchart that supports techniques to mitigate asymmetric long delay stress in accordance with examples as disclosed herein.

FIG. 3 illustrates an example of an access operation cycle flowchart 300 that supports techniques to mitigate asymmetric long delay stress in accordance with examples as disclosed herein. Access operation cycle flowchart 300 may represent a method or methods performed by a memory device (e.g., a memory device 110) on a memory cell (e.g., a memory cell 205) during a cell access operation cycle. The cell access operation cycle may include a first phase 302, a second phase 303, and a third phase 304. The second phase 303 may follow the first phase 302 and the third phase 304 may follow the second phase 303. In some examples, the first phase 302, the second phase 303, and/or the third phase 304 may at least partially overlap.

During the first phase 302 of the cell access operation cycle, at 305, the memory device may perform an activate on the memory cell (e.g., the memory device may activate the memory cell). In some examples, performing the activate may include sensing a status of the memory cell and/or making data available for a read operation. In some examples, performing the activate may include the memory device writing a first state (e.g., a logical '1') to the memory cell.

Additionally or alternatively, during the first phase 302 of the cell access operation cycle, at 310, the memory device may writeback (e.g., with a random flip) the first state or a second state (e.g., a logical '0'). For instance, the memory device may select (e.g., randomly) one of the first state or the second state (e.g., according to a random distribution, according a generated distribution generated by one or more components) and may writeback the selected one of the first state or the second state. In some examples, 310 may occur after 305 (e.g., 310 may not partially overlap with 305). In other examples, the memory device may select the one of the first state or the second state according to one or more factors (e.g., the memory device may select the one of the first state or the second state in a non-random manner using some generated distribution that may be generated by the memory device, received from another device, may be loaded from a lookup table or other stored source, or may be based on an indication received from another device). It should be noted that, due to the data of the memory cell already being sensed during first phase 302, the access time (e.g., tRCD) may not change. In some examples, 310 may be part of a fourth phase between the first phase 302 and the second phase 303 (e.g., a writing phase for 310 may be added to or included as part of a minimum row active time (e.g., tRAS_min)).

During the second phase 303 of the cell access operation cycle, at 315, the memory device may perform one or more logical operations with the memory cell. For instance, the memory device may perform a read or a write on the memory cell. In some examples, the memory device may maintain the first state or the second state (e.g., whichever state written back to the memory cell at 310) during the second phase 303 of the cell access operation cycle. In some examples, the second phase 303 may be limited according to a maximum delay (e.g., a maximum delay given by a row active time (e.g., tRAS)).

During the third phase 304 of the cell access operation cycle, at 320, the memory device may write the first state to the memory cell. By writing the first state to the memory cell, the memory cell may recover the first state (e.g., in cases where the second state was written to the memory cell at 310). Additionally or alternatively, during the third phase 304, at 325, the memory device may perform a precharge on the memory cell (e.g., the memory device may precharge the memory cell). In some examples, performing the precharge may involve the memory cell writing (e.g., with a random flip) the second state to the memory cell with. For instance, the memory device may select randomly one of the first state or the second state (e.g., according to a random distribution) and may write the selected one of the first state or the second state. In some examples, 325 may occur after 320. In other examples, the memory device may select the one of the first state or the second state according to one or more factors (e.g., the memory device may select the one of the first state or the second state in a non-random manner).

The techniques as described herein may be used to avoid and/or mitigate systematic ALD0 and/or ALD1 cell stress during a continuous open page access. For instance, performing the write back at 310 may ensure that a memory cell spends the second phase 303 alternating between two levels (e.g., a first level associated with a logical '1' and a second level associated with a logical '0'). Additionally, performing the write at 320 before performing the precharge may ensure that one level is written at the memory cell at a time. Such techniques may reduce the cell wear-out during continuous open page time and/or may improve the cell time to fail during continuous open page time. Additionally or alternatively, such techniques may resolve (e.g., remove) the ALD1 and/or ALD0 failure mechanism without impacting or impacting less the access time (e.g., tRCD).

Figure 4A:
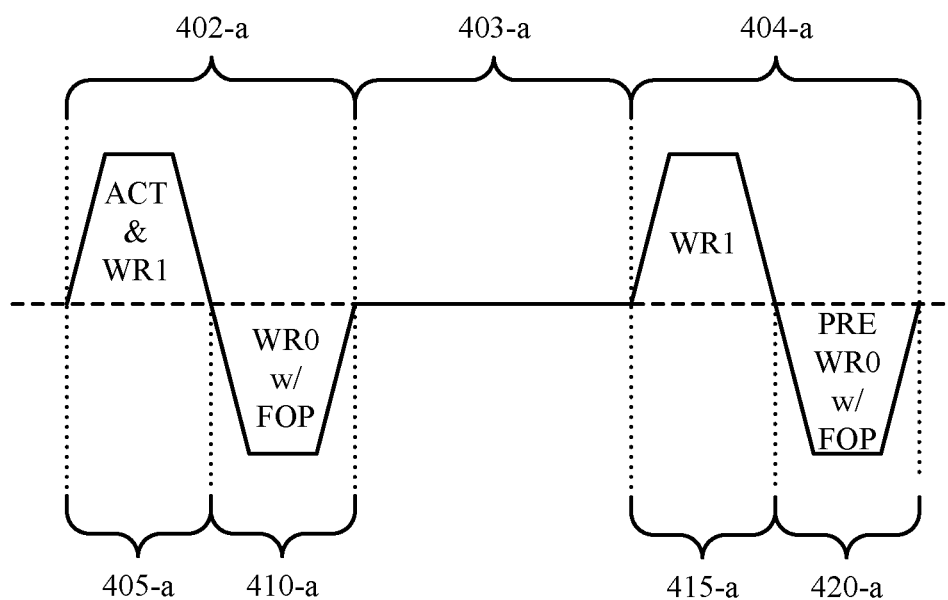
FIGS. 4A and 4B illustrate examples of access operation cycle timing diagrams that supports techniques to mitigate asymmetric long delay stress in accordance with examples as disclosed herein.
Figure 4B:
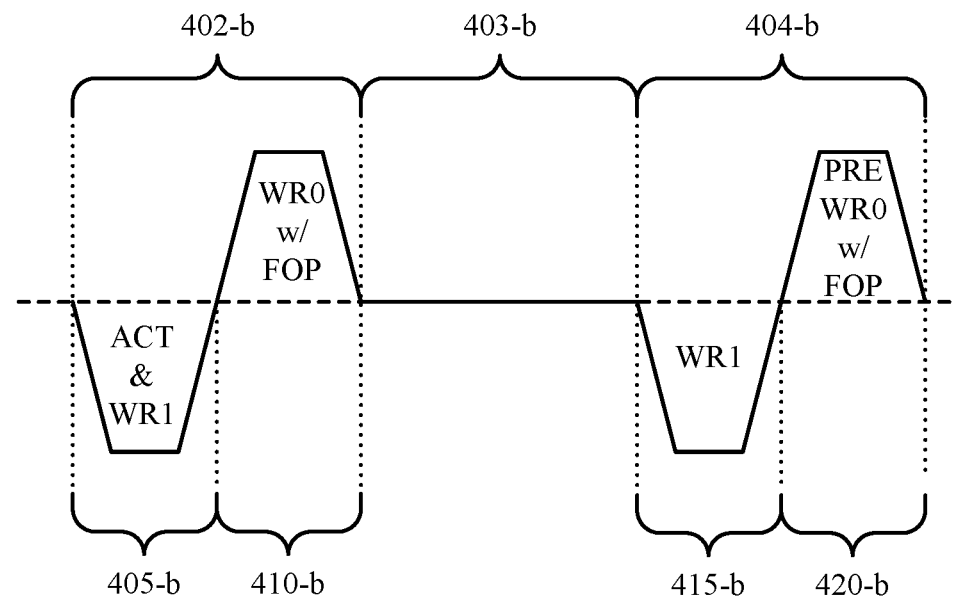

FIGS. 4A and 4B illustrate examples of access operation cycle timing diagrams 400-a and 400-b that supports techniques to mitigate asymmetric long delay stress in accordance with examples as disclosed herein. FIG. 4A may represent a timing diagram for an access operation cycle when a memory device (e.g., a memory device 110) performs a positive activate (e.g., an activate in the first quadrant) on a memory cell (e.g., a memory cell 205) and FIG. 4B may represent a timing diagram for an access operation cycle when the memory device performs a negative activate (e.g., an activate in the third quadrant) on the memory cell. The timing diagram aspects shown in FIG. 4A and/or FIG. 4B may be implemented or performed by or may be related to the system 100 and/or memory die 200, among other implementations or examples.

In access operation cycle timing diagram 400-a, the cell access operation cycle may include a first phase 402-a, a second phase 403-a, and a third phase 404-a. The second phase 403-a may follow the first phase 402-a and the third phase 404-a may follow the second phase 403-a. During the first phase 402-a of the cell access operation cycle, at 405-a, the memory device may perform a positive activate on the memory cell (e.g., the memory device may activate the memory cell in the first quadrant). In some examples, performing the activate may include the memory device writing a first state (e.g., a logical '0') to the memory cell. Additionally or alternatively, during the first phase 402-a of the cell access operation cycle, at 410-a, the memory device may writeback (e.g., with a random flip) the first state or a second state (e.g., a logical '1'). For instance, the memory device may select randomly one of the first state or the second state (e.g., according to a random distribution) and may writeback the selected one of the first state or the second state.

During the second phase 403-a of the cell access operation cycle, the memory device may perform one or more logical operations with the memory cell. For instance, the memory device may perform a read or a write on the memory cell. In some examples, the memory device may maintain the first state or the second state (e.g., whichever state written back to the memory cell at 410-a) during the second phase 403-a of the cell access operation cycle. In some examples, the second phase 403-a may represent an open page time, in which a row buffer including the memory cell is kept open.

During the third phase 404-a of the cell access operation cycle, at 415-a, the memory device may write the first state to the memory cell. Additionally or alternatively, during the third phase 404-a, at 420-a, the memory device may perform a precharge on the memory cell (e.g., the memory device may precharge the memory cell). In some examples, performing the precharge may involve the memory cell writing (e.g., with a random flip) the second state to the memory cell with. For instance, the memory device may select randomly one of the first state or the second state (e.g., according to a random distribution) and may write the selected one of the first state or the second state (e.g., the memory device may perform an FOP).

In access operation cycle timing diagram 400-b, the cell access operation cycle may include a first phase 402-b, a second phase 403-b, and a third phase 404-b. The second phase 403-b may follow the first phase 402-b, and the third phase 404-b may follow the second phase 403-b. During the first phase 402-b of the cell access operation cycle, at 405-b, the memory device may perform a negative activate on the memory cell (e.g., the memory device may activate the memory cell in the third quadrant). In some examples, performing the activate may include the memory device writing a first state (e.g., a logical '1') to the memory cell. Additionally or alternatively, during the first phase 402-b of the cell access operation cycle, at 410-b, the memory device may writeback (e.g., with a random flip generated by the memory device) the first state or a second state (e.g., a logical '0'). For instance, the memory device may select randomly one of the first state or the second state (e.g., according to a random distribution) and may writeback the selected one of the first state or the second state.

During the second phase 403-b of the cell access operation cycle, the memory device may perform one or more logical operations with the memory cell. For instance, the memory device may perform a read or a write on the memory cell. In some examples, the memory device may maintain the first state or the second state (e.g., whichever state written back to the memory cell at 410-b) during the second phase 403-b of the cell access operation cycle. In some examples, the second phase 403-b may represent an open page time, in which a row buffer including the memory cell is kept open.

During the third phase 404-b of the cell access operation cycle, at 415-b, the memory device may write the first state to the memory cell. Additionally or alternatively, during the third phase 404-b, at 420-b, the memory device may perform a precharge on the memory cell (e.g., the memory device may precharge the memory cell). In some examples, performing the precharge may involve the memory cell writing (e.g., with a random flip) the second state to the memory cell with. For instance, the memory device may select randomly one of the first state or the second state (e.g., according to a random distribution) and may write the selected one of the first state or the second state (e.g., the memory device may perform an FOP).

Figure 5:
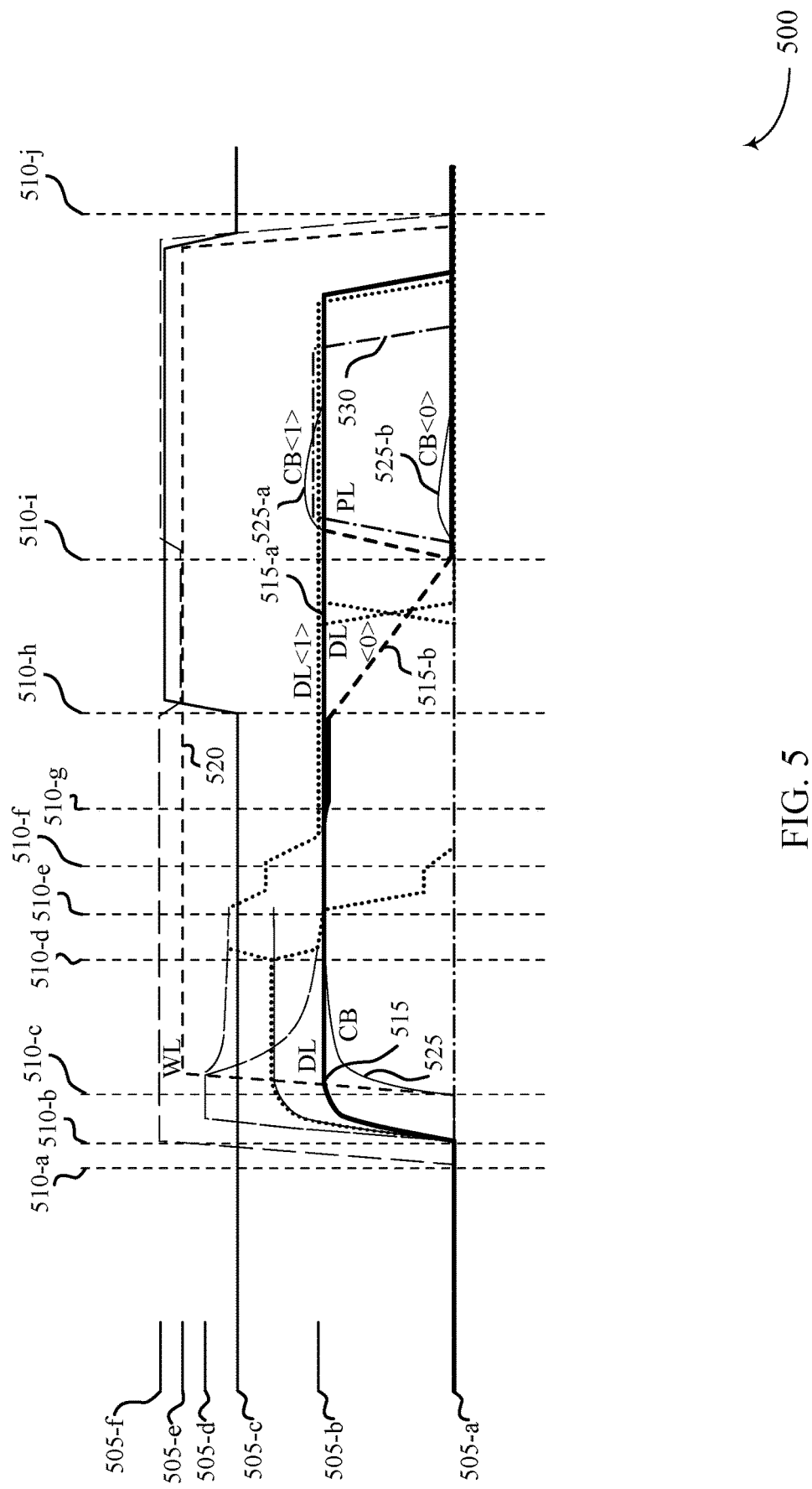
FIG. 5 illustrates an example of an access operation timing diagram that supports techniques to mitigate asymmetric long delay stress in accordance with examples as disclosed herein.

FIG. 5 illustrates an example of an access operation cycle timing diagram 500 that supports techniques to mitigate asymmetric long delay stress in accordance with examples as disclosed herein. FIG. 5 may represent a timing diagram for an access operation cycle that illustrates voltages for one or more components of a memory device (e.g., a memory device 110).

Digit line voltage 515 may represent voltage on a digit line (e.g., a digit line 215 as described with reference to FIG. 2). Digit line voltage 515-a may represent voltage on the digit line whenever a memory cell stores a first state (e.g., a logical '1') and digit line voltage 515-b may represent voltage on the digit line whenever a memory cell stores a second state (e.g., a logical '0'). Word line voltage 520 may represent voltage on a word line (e.g., a word line 210 as described with reference to FIG. 2). Cell bottom voltage 525 may represent voltage at a cell bottom associated with a memory cell (e.g., a node between switching component 245 and capacitor 240 as described with reference to FIG. 2). Cell bottom voltage 525-a may represent a voltage at the cell bottom when the memory cell stores the first state and cell bottom voltage 525-b may represent a voltage at the cell bottom when the memory cell stores the second state. Plate line voltage 530 may represent a voltage at a plate line (e.g., a plate line 220 as described with reference to FIG. 2)

The voltages as described herein may be at one or more voltage levels. For instance, first voltage level 505-a may represent a ground voltage (e.g., 0 volts); second voltage level 505-b may represent a voltage level higher than the first voltage level 505-a (e.g., a digit line voltage (DLV)); third voltage level 505-c may represent a voltage level higher than the second voltage level 505-b; fourth voltage level 505-d may represent a voltage level higher than the third voltage level 505-c (e.g., 3.2 V); fifth voltage level 505-e may represent a voltage level higher than the fourth voltage level 505-d (e.g., 3.4 V); and sixth voltage level 505-f may represent a voltage level higher than fifth voltage level 505-e (e.g., 3.6 V).

Before 510-a, a memory device may be in an idle mode. At 510-b, a charge may be applied to a digit line. Accordingly, digit line voltage 515 may transition, starting at 510-b, from first voltage level 505-a to second voltage level 505-b. At 510-c, word line voltage 520 may transition from first voltage level 505-a to fifth voltage level 505-e. Additionally, at 510-c, cell bottom voltage 525 may transition from first voltage level 505-a to second voltage level 505-b. Between 510-c and 510-d, the memory device may perform signal development associated with performing an activate. Between 510-e and 510-f, the memory device may perform signal amplification and between 510-f and 510-g, the memory device may fire a sense amplifier of the memory device. In some examples, one or more of the time between one of 510-a through 510-g and another of 510-a through 510-g may correspond to 305 as described with reference to FIG. 3.

Between 510-g and 510-h, if the memory cell stores the first state, digit line voltage 515 may follow digit line voltage 515-a. Alternatively, if the memory cell stores the second state, digit line voltage 515 may follow digit line voltage 515-b. Digit line voltage 515-b may decrease by a greater amount (e.g., over time) relative to digit line voltage 515-a. At or after 510-h, the memory device may writeback the first state or the second state to the memory cell (e.g., as described with reference to 310 of FIG. 3).

Between 510-*h* and 510-*i*, digit line voltage 515-*b* may transition to first voltage level 505-*a* and digit line voltage 515-*a* may transition to or be maintained at second voltage level 505-*b*. In some examples, one or more of the time between one of 510-*g* through 510-*i* and another of 510-*g* through 510-*i* may correspond to 315 as described with reference to FIG. 3 and/or may be associated with performing one or more access operations, such as one or more read operations and/or one or more write operations.

At 510-*i*, the memory device may write the first state to the memory cell (e.g., as described with reference to 320 of FIG. 3). Additionally or alternatively, at or after 510-*i*, memory device may begin to precharge the memory cell. For instance, at 510-*i*, the digit line voltage 515-*b* may transition from the first voltage level 505-*a* to the second voltage level 505-*b*. After or at 510-*i*, if the memory cell stores the first state (e.g., a logical '1'), cell bottom voltage 525-*a* may transition from the second voltage level 505-*b* to a higher level and then may settle back at the second voltage level 505-*b*. Alternatively, if the memory cell stores the second state (e.g., a logical '0'), cell bottom voltage 525-*b* may transition from the first voltage level 505-*a* to a higher level and then may settle back at the first voltage level 505-*a*. After or at 510-*i*, the plate line voltage 530 may transition from the first voltage level 505-*a* to a seventh voltage level (e.g., a voltage level above the second voltage level 505-*b* but below the third voltage level 505-*c*).

After transitioning to the seventh voltage level, the plate line voltage 530 may transition back to the first voltage level 505-*a*. After plate line voltage 530 transitions back to the first voltage level 505-*a*, the digit line voltage 515 may transition from the second voltage level 505-*b* to the first voltage level 505-*a*. After digit line voltage 515 transitions to the first voltage level 505-*a*, the word line voltage 520 may transition to the first voltage level 505-*a*. By 510-*j*, each of digit line voltage 515, word line voltage 520, cell bottom voltage 525, and plate line voltage 530 may be at the first voltage level 505-*a* and the memory device may be in an idle mode. In some examples, at least some of the time spanned between 510-*i* and 510-*j* may correspond to 325 as described with reference to FIG. 3 and may be associated with performing a precharge on the memory cell.

Figure 6:
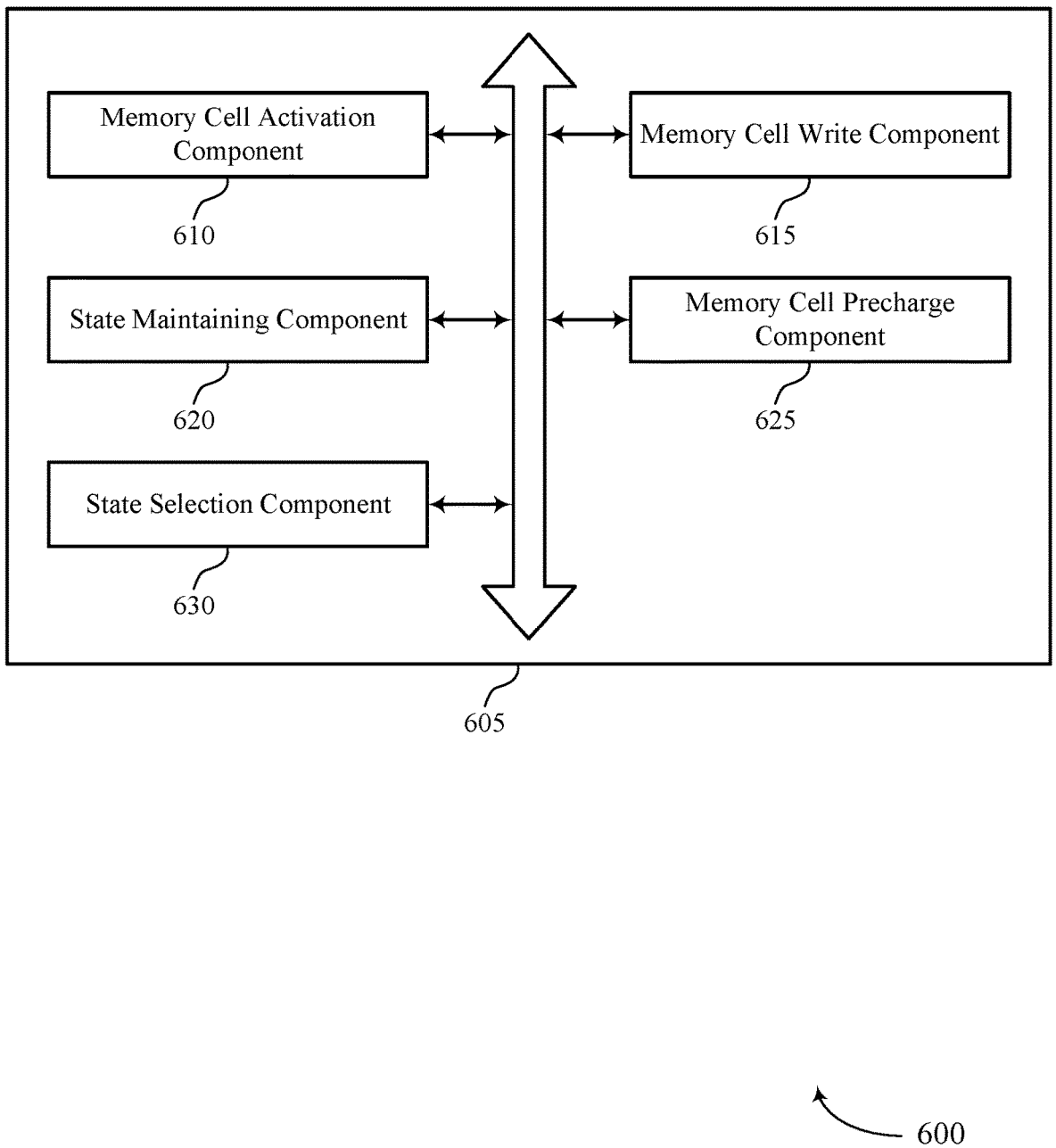
FIG. 6 shows a block diagram of a memory device that supports techniques to mitigate asymmetric long delay stress in accordance with examples as disclosed herein.

FIG. 6 shows a block diagram 600 of a memory device 605 that supports techniques to mitigate asymmetric long delay stress in accordance with examples as disclosed herein. The memory device 605 may be an example of aspects of a memory device as described with reference to FIGS. 3 through 5. The memory device 605 may include a memory cell activation component 610, a memory cell write component 615, a state maintaining component 620, a memory cell precharge component 625, and a state selection component 630. Each of these modules may communicate, directly or indirectly, with one another (e.g., via one or more buses).

The memory cell activation component 610 may activate a memory cell during a first phase of an access operation cycle.

The memory cell write component 615 may write a first state or a second state to the memory cell during the first phase of the access operation cycle. In some examples, the memory cell write component 615 may write, during the third phase of the access operation cycle, the second state to the memory cell based on writing the first state or the second state to the memory cell during the first phase of the access operation cycle. In some examples, the memory cell write component 615 may write, during the third phase of the access operation cycle and as part of precharging the memory cell, the first state or the second state to the memory cell based on writing the second state to the memory cell during the third phase of the access operation cycle. In some examples, the memory cell write component 615 writing the first state to the memory cell during the third phase of the access operation cycle occurs before precharging the memory cell. In some examples, the memory cell write component 615 may write, during the first phase of the access operation cycle and as part of activating the memory cell, the second state to the memory cell.

The state maintaining component 620 may maintain the first state or the second state at the memory cell during a second phase of the access operation cycle after the first phase of the access operation cycle.

The memory cell precharge component 625 may precharge the memory cell during a third phase of the access operation cycle after the second phase of the access operation cycle.

The state selection component 630 may select randomly the first state or the second state for writing the first state or the second state to the memory cell as part of precharging the memory cell. In some examples, the state selection component 630 may select randomly the first state or the second state for writing the first state or the second state to the memory cell during the first phase of the access operation cycle.

Figure 7:
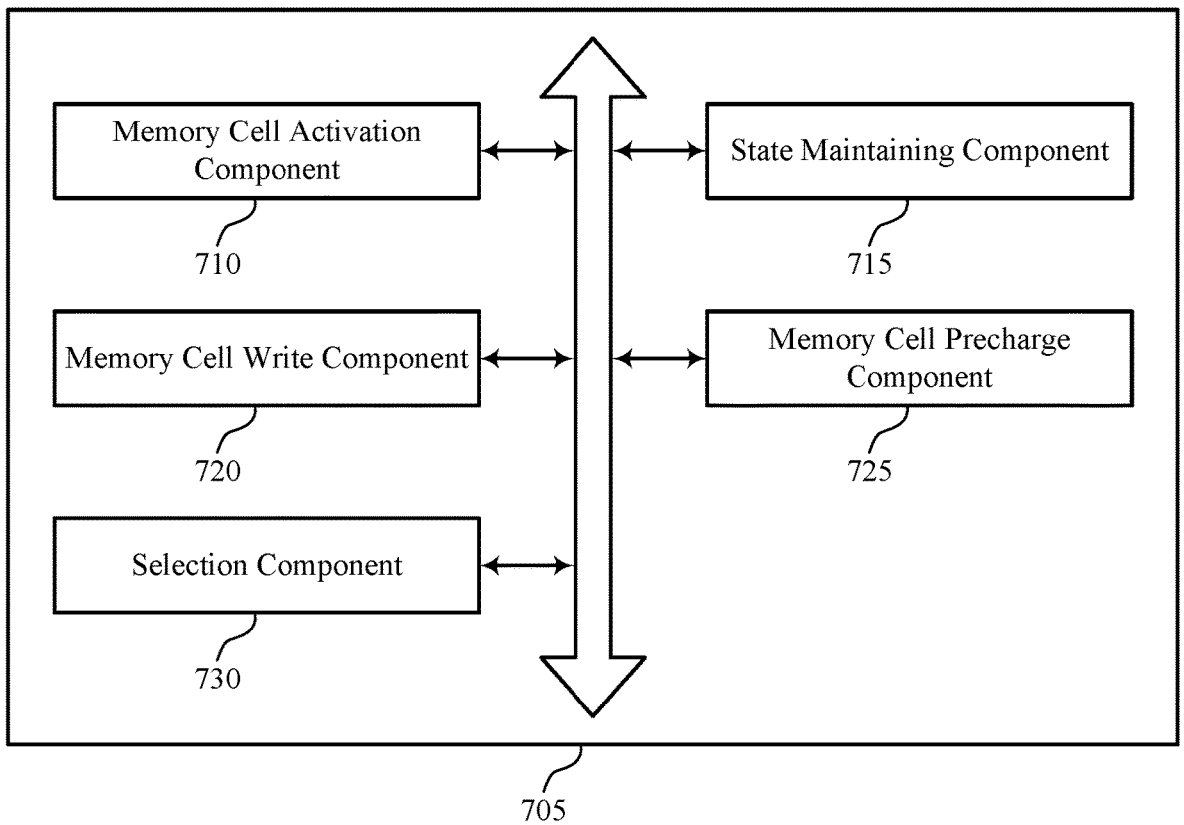
FIG. 7 shows a block diagram of a memory device that supports techniques to mitigate asymmetric long delay stress in accordance with examples as disclosed herein.

FIG. 7 shows a block diagram 700 of a memory device 705 that supports techniques to mitigate asymmetric long delay stress in accordance with examples as disclosed herein. The memory device 705 may be an example of aspects of a memory device as described with reference to FIGS. 3 through 5. The memory device 705 may include a memory cell activation component 710, a state maintaining component 715, a memory cell write component 720, a memory cell precharge component 725, and a selection component 730. Each of these modules may communicate, directly or indirectly, with one another (e.g., via one or more buses).

The memory cell activation component 710 may activate a memory cell during a first phase of an access operation cycle.

The state maintaining component 715 may maintain a first state or a second state at the memory cell during a second phase of the access operation cycle after the first phase of the access operation cycle.

The memory cell write component 720 may write, during a third phase of the access operation cycle after the second phase of the access operation cycle, the second state to the memory cell. In some examples, the memory cell write component 720 may write, during the first phase of the access operation cycle, the first state or the second state to the memory cell, where maintaining the first state or the second state at the memory cell during the second phase of access operation cycle is based on writing the first state or the second state at the memory cell during the first phase of the access operation cycle. In some examples, the memory cell write component 720 may write, during the third phase of the access operation cycle and as part of precharging the memory cell, the first state or the second state at the memory cell based on writing the second state at the memory cell during the third phase of the access operation cycle. In some examples, the memory cell write component 720 may write, during the first phase of the access operation cycle and as part of activating the memory cell, the second state at the memory cell.

The memory cell precharge component 725 may precharge during the third phase of the access operation cycle and based on writing the second state to the memory cell.

The selection component 730 may select randomly the first state or the second state at the memory cell for writing the first state or the second state at the memory cell during the first phase of the access operation cycle. In some examples, the selection component 730 may select randomly the first state or the second state for writing the first state or the second state at the memory cell as part of precharging the memory cell.

Figure 8:
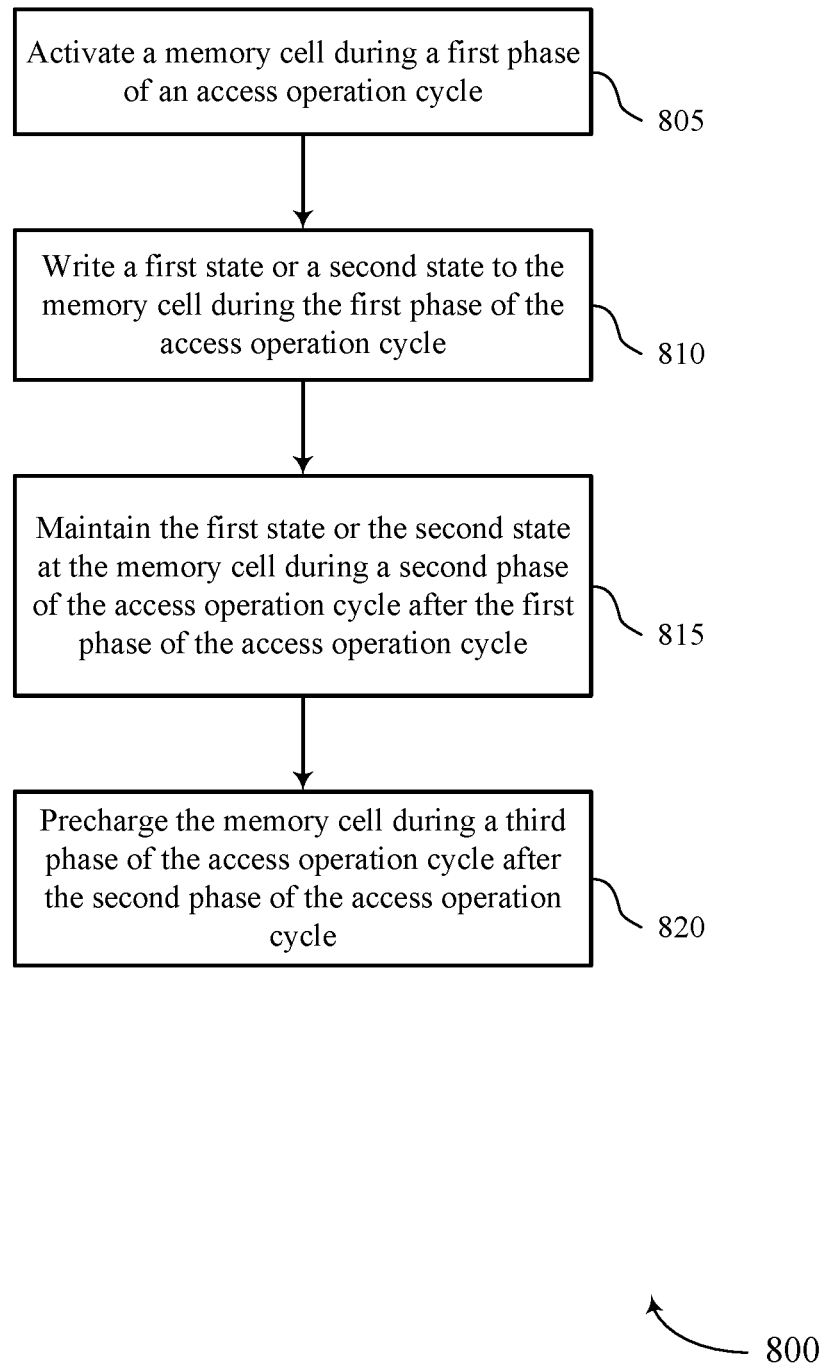
FIGS. 8 and 9 show flowcharts illustrating a method or methods that support techniques to mitigate asymmetric long delay stress in accordance with examples as disclosed herein.

FIG. 8 shows a flowchart illustrating a method or methods 800 that supports techniques to mitigate asymmetric long delay stress in accordance with examples as disclosed herein. The operations of method 800 may be implemented by a memory device or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may activate a memory cell during a first phase of an access operation cycle. The operations of 805 may be performed according to the methods described herein. In some examples, aspects of the operations of 805 may be performed by a memory cell activation component as described with reference to FIG. 6.

At 810, the memory device may write a first state or a second state to the memory cell during the first phase of the access operation cycle. The operations of 810 may be performed according to the methods described herein. In some examples, aspects of the operations of 810 may be performed by a memory cell write component as described with reference to FIG. 6.

At 815, the memory device may maintain the first state or the second state at the memory cell during a second phase of the access operation cycle after the first phase of the access operation cycle. The operations of 815 may be performed according to the methods described herein. In some examples, aspects of the operations of 815 may be performed by a state maintaining component as described with reference to FIG. 6.

At 820, the memory device may precharge the memory cell during a third phase of the access operation cycle after the second phase of the access operation cycle. The operations of 820 may be performed according to the methods described herein. In some examples, aspects of the operations of 820 may be performed by a memory cell precharge component as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for activating a memory cell during a first phase of an access operation cycle, writing a first state or a second state to the memory cell during the first phase of the access operation cycle, maintaining the first state or the second state at the memory cell during a second phase of the access operation cycle after the first phase of the access operation cycle, and precharging the memory cell during a third phase of the access operation cycle after the second phase of the access operation cycle.

Some examples of the method 800 and the apparatus described herein may further include operations, features, means, or instructions for writing, during the third phase of the access operation cycle, the second state to the memory cell based on writing the first state or the second state to the memory cell during the first phase of the access operation cycle.

Some examples of the method 800 and the apparatus described herein may further include operations, features, means, or instructions for writing, during the third phase of the access operation cycle and as part of precharging the memory cell, the first state or the second state to the memory cell based on writing the second state to the memory cell during the third phase of the access operation cycle.

Some examples of the method 800 and the apparatus described herein may further include operations, features, means, or instructions for selecting randomly the first state or the second state for writing the first state or the second state to the memory cell as part of precharging the memory cell.

In some examples of the method 800 and the apparatus described herein, writing the first state to the memory cell during the third phase of the access operation cycle occurs before precharging the memory cell.

Some examples of the method 800 and the apparatus described herein may further include operations, features, means, or instructions for writing, during the first phase of the access operation cycle and as part of activating the memory cell, the second state to the memory cell.

Some examples of the method 800 and the apparatus described herein may further include operations, features, means, or instructions for selecting randomly the first state or the second state for writing the first state or the second state to the memory cell during the first phase of the access operation cycle.

Figure 9:
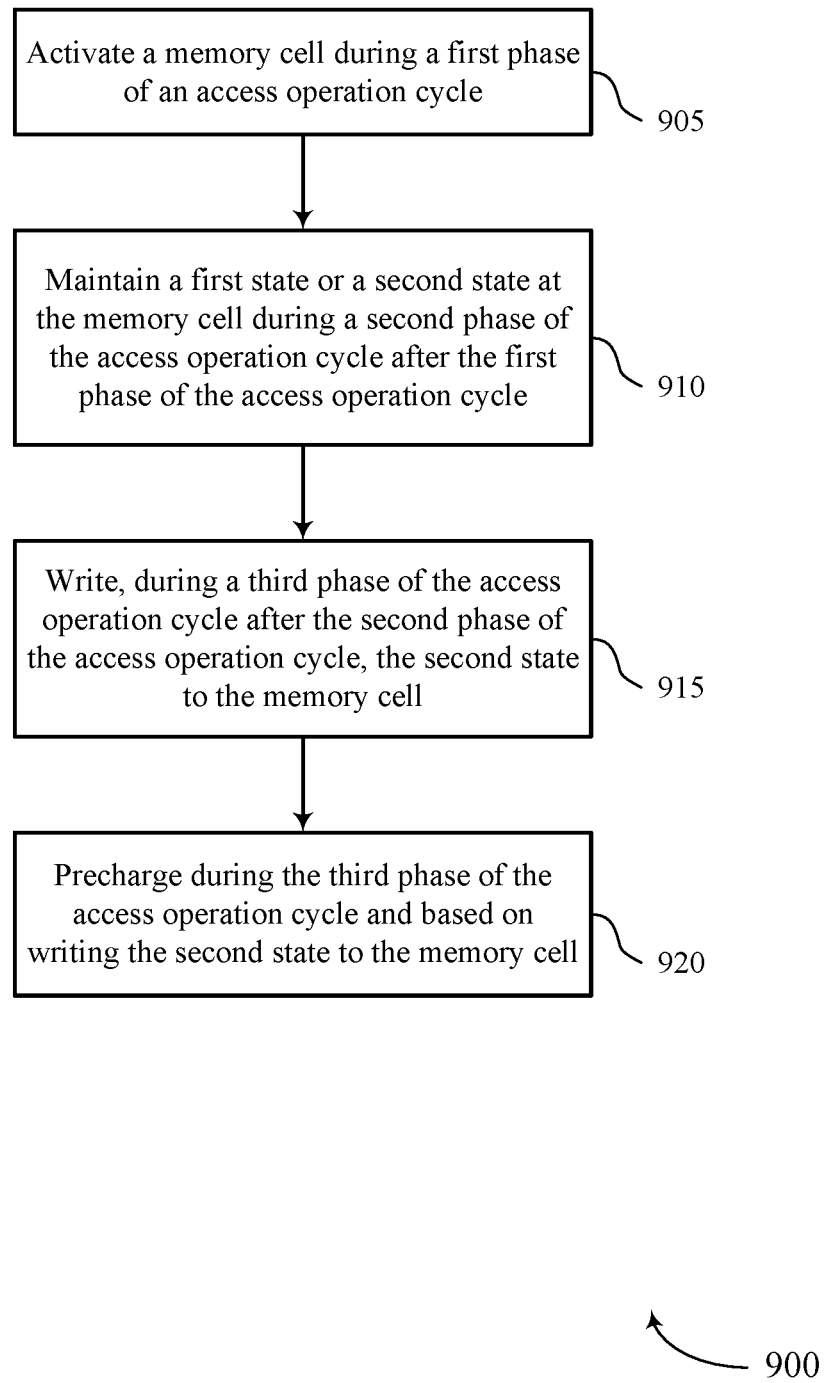

FIG. 9 shows a flowchart illustrating a method or methods 900 that supports techniques to mitigate asymmetric long delay stress in accordance with examples as disclosed herein. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may activate a memory cell during a first phase of an access operation cycle. The operations of 905 may be performed according to the methods described herein. In some examples, aspects of the operations of 905 may be performed by a memory cell activation component as described with reference to FIG. 7.

At 910, the memory device may maintain a first state or a second state at the memory cell during a second phase of the access operation cycle after the first phase of the access operation cycle. The operations of 910 may be performed according to the methods described herein. In some examples, aspects of the operations of 910 may be performed by a state maintaining component as described with reference to FIG. 7.

At 915, the memory device may write, during a third phase of the access operation cycle after the second phase of the access operation cycle, the second state to the memory cell. The operations of 915 may be performed according to the methods described herein. In some examples, aspects of the operations of 915 may be performed by a memory cell write component as described with reference to FIG. 7.

At 920, the memory device may precharge during the third phase of the access operation cycle and based on writing the second state to the memory cell. The operations of 920 may be performed according to the methods described herein. In some examples, aspects of the operations of 920 may be performed by a memory cell precharge component as described with reference to FIG. 7.

In some examples, an apparatus as described herein may perform a method or methods, such as the method 900. The apparatus may include features, means, or instructions (e.g., a non-transitory computer-readable medium storing instructions executable by a processor) for activating a memory cell during a first phase of an access operation cycle, maintaining a first state or a second state at the memory cell during a second phase of the access operation cycle after the first phase of the access operation cycle, writing, during a third phase of the access operation cycle after the second phase of the access operation cycle, the second state to the memory cell, and precharging during the third phase of the access operation cycle and based on writing the second state to the memory cell.

Some examples of the method 900 and the apparatus described herein may further include operations, features, means, or instructions for writing, during the first phase of the access operation cycle, the first state or the second state to the memory cell, where maintaining the first state or the second state at the memory cell during the second phase of access operation cycle may be based on writing the first state or the second state at the memory cell during the first phase of the access operation cycle.

Some examples of the method 900 and the apparatus described herein may further include operations, features, means, or instructions for selecting randomly the first state or the second state at the memory cell for writing the first state or the second state at the memory cell during the first phase of the access operation cycle.

Some examples of the method 900 and the apparatus described herein may further include operations, features, means, or instructions for writing, during the third phase of the access operation cycle and as part of precharging the memory cell, the first state or the second state at the memory cell based on writing the second state at the memory cell during the third phase of the access operation cycle.

Some examples of the method 900 and the apparatus described herein may further include operations, features, means, or instructions for selecting randomly the first state or the second state for writing the first state or the second state at the memory cell as part of precharging the memory cell.

Some examples of the method 900 and the apparatus described herein may further include operations, features, means, or instructions for writing, during the first phase of the access operation cycle and as part of activating the memory cell, the second state at the memory cell.

It should be noted that the methods described herein are possible implementations, and that the operations and the steps may be rearranged or otherwise modified and that other implementations are possible. Further, portions from two or more of the methods may be combined.

An apparatus is described. The apparatus may include a memory array including a set of memory cells, a controller coupled with the memory array and operable to cause the apparatus to activate a memory cell of the plurality of memory cells during a first phase of an access operation cycle; write a first state or a second state to the memory cell during the first phase of the access operation cycle; maintain the first state or the second state at the memory cell a second phase of the access operation cycle after the first phase of the access operation cycle; and precharge the memory cell during a third phase of the access operation cycle after the second phase of the access operation cycle.

Some examples may further include writing, during the third phase of the access operation cycle, the second state at the memory cell based on writing the first state or the second state at the memory cell during the first phase of the access operation cycle.

Some examples may further include writing, during the third phase of the access operation cycle and as part of precharging the memory cell, the first state or the second state at the memory cell based on writing the second state at the memory cell during the third phase of the access operation cycle.

Some examples may further include writing, during the first phase of the access operation cycle and as part of activating the memory cell, the second state at the memory cell.

Some examples may further include selecting the first state or the second state for writing the first state or the second state at the memory cell during the first phase of the access operation cycle.

In some examples, each memory cell of the set of memory cells includes a ferroelectric capacitor configured to store a charge corresponding to the first state or the second state.

An apparatus is described. The apparatus may include a memory array including a set of memory cells, a controller coupled with the memory array and operable to cause the apparatus to activate a memory cell during a first phase of an access operation cycle; maintain a first state or a second state at the memory cell during a second phase of the access operation cycle after the first phase of the access operation cycle; write, during a third phase of the access operation cycle after the second phase of the access operation cycle, the second state at the memory cell; and precharge during the third phase of the access operation cycle and based at least in part on writing the second state at the memory cell.

Some examples may further include writing, during the first phase of the access operation cycle, the first state or the second state at the memory cell, where maintaining the first state or the second state at the memory cell during the second phase of access operation cycle may be based on writing the first state or the second state at the memory cell during the first phase of the access operation cycle.

Some examples may further include selecting the first state or the second state at the memory cell for writing the first state or the second state at the memory cell during the first phase of the access operation cycle.

Some examples may further include writing, during the third phase of the access operation cycle and as part of precharging the memory cell, the first state or the second state at the memory cell based on writing the second state at the memory cell during the third phase of the access operation cycle.

Some examples may further include writing, during the first phase of the access operation cycle and as part of activating the memory cell, the second state at the memory cell.

In some examples, each memory cell of the set of memory cells includes a ferroelectric capacitor configured to store a charge corresponding to the first state or the second state.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    activating a memory cell during a first phase of an access operation cycle;
    writing a first state or a second state to the memory cell during the first phase of the access operation cycle;
    maintaining the first state or the second state at the memory cell during a second phase of the access operation cycle after the first phase of the access operation cycle;
    writing, during a third phase of the access operation cycle, the second state to the memory cell based at least in part on writing the first state or the second state to the memory cell during the first phase of the access operation cycle;
    writing, during the third phase of the access operation cycle and as part of precharging the memory cell, the first state or the second state to the memory cell based at least in part on writing the second state to the memory cell during the third phase of the access operation cycle; and
    precharging the memory cell during the third phase of the access operation cycle after the second phase of the access operation cycle.

2. The method of claim 1, further comprising:
    selecting randomly the first state or the second state for writing the first state or the second state to the memory cell during the first phase of the access operation cycle.

3. The method of claim 1, further comprising:
    selecting randomly the first state or the second state for writing the first state or the second state to the memory cell as part of precharging the memory cell.

4. The method of claim 1, wherein writing the first state to the memory cell during the third phase of the access operation cycle occurs before precharging the memory cell.

5. The method of claim 1, further comprising:
    writing, during the first phase of the access operation cycle and as part of activating the memory cell, the second state to the memory cell.

6. The method of claim 1, wherein each memory cell of the plurality of memory cells comprises a ferroelectric capacitor to store a charge corresponding to the first state or the second state.

7. A method, comprising:
    activating a memory cell during a first phase of an access operation cycle;
    maintaining a first state or a second state at the memory cell during a second phase of the access operation cycle after the first phase of the access operation cycle;
    writing, during a third phase of the access operation cycle after the second phase of the access operation cycle, the second state to the memory cell;
    writing, during the third phase of the access operation cycle and as part of precharging the memory cell, the first state or the second state at the memory cell based at least in part on writing the second state at the memory cell during the third phase of the access operation cycle; and
    precharging during the third phase of the access operation cycle and based at least in part on writing the second state to the memory cell.

8. The method of claim 7, further comprising:
    writing, during the first phase of the access operation cycle, the first state or the second state to the memory cell, wherein maintaining the first state or the second state at the memory cell during the second phase of the access operation cycle is based at least in part on writing the first state or the second state at the memory cell during the first phase of the access operation cycle.

9. The method of claim 8, further comprising:
    selecting randomly the first state or the second state at the memory cell for writing the first state or the second state at the memory cell during the first phase of the access operation cycle.

10. The method of claim 7, further comprising:
    selecting randomly the first state or the second state for writing the first state or the second state at the memory cell as part of precharging the memory cell.

11. The method of claim 7, further comprising:
    writing, during the first phase of the access operation cycle and as part of activating the memory cell, the second state at the memory cell.

12. The method of claim 7, wherein each memory cell of the plurality of memory cells comprises a ferroelectric capacitor to store a charge corresponding to the first state or the second state.

13. An apparatus, comprising:
    a memory array comprising a plurality of memory cells; and
    a controller coupled with the memory array and operable to cause the apparatus to:
        activate a memory cell of the plurality of memory cells during a first phase of an access operation cycle;
        write a first state or a second state to the memory cell during the first phase of the access operation cycle;
        maintain the first state or the second state at the memory cell a second phase of the access operation cycle after the first phase of the access operation cycle;
        write, during the third phase of the access operation cycle, the second state at the memory cell based at least in part on writing the first state or the second state at the memory cell during the first phase of the access operation cycle;
        write, during a third phase of the access operation cycle and as part of precharging the memory cell, the first state or the second state at the memory cell based at least in part on writing the second state at the memory cell during the third phase of the access operation cycle; and precharge the memory cell during the third phase of the access operation cycle after the second phase of the access operation cycle.

14. The apparatus of claim 13, wherein the controller is further operable to cause the apparatus to:

write, during the first phase of the access operation cycle and as part of activating the memory cell, the second state at the memory cell.

15. The apparatus of claim 13, wherein the controller is further operable to cause the apparatus to:

select the first state or the second state for writing the first state or the second state at the memory cell during the first phase of the access operation cycle.

16. The apparatus of claim 15, wherein the controller being operable to select the first state or the second state comprises the controller being operable to cause the apparatus to:

select randomly the first state or the second state for writing the first state or the second state to the memory cell during the first phase of the access operation cycle.

17. The apparatus of claim 13, wherein each memory cell of the plurality of memory cells comprises a ferroelectric capacitor configured to store a charge corresponding to the first state or the second state.

18. The apparatus of claim 13, wherein the controller is further operable to cause the apparatus to:

select randomly the first state or the second state for writing the first state or the second state to the memory cell as part of precharging the memory cell.

19. An apparatus, comprising:

a memory array comprising a plurality of memory cells; and a controller coupled with the memory array and operable to cause the apparatus to:

activate a memory cell during a first phase of an access operation cycle;

maintain a first state or a second state at the memory cell during a second phase of the access operation cycle after the first phase of the access operation cycle;

write, during a third phase of the access operation cycle after the second phase of the access operation cycle, the second state at the memory cell;

write, during the third phase of the access operation cycle and as part of precharging the memory cell, the first state or the second state at the memory cell based at least in part on writing the second state at the memory cell during the third phase of the access operation cycle; and precharge during the third phase of the access operation cycle and based at least in part on writing the second state at the memory cell.

20. The apparatus of claim 19, wherein the controller is further operable to cause the apparatus to:

write, during the first phase of the access operation cycle, the first state or the second state at the memory cell, wherein maintaining the first state or the second state at the memory cell during the second phase of the access operation cycle is based at least in part on writing the first state or the second state at the memory cell during the first phase of the access operation cycle.

21. The apparatus of claim 20, wherein the controller is further operable to cause the apparatus to:

select the first state or the second state at the memory cell for writing the first state or the second state at the memory cell during the first phase of the access operation cycle.

22. The apparatus of claim 21, wherein the controller being operable to select the first state or the second state comprises the controller being operable to cause the apparatus to:

select randomly the first state or the second state for writing the first state or the second state to the memory cell during the first phase of the access operation cycle.

23. The apparatus of claim 21, wherein the controller is further operable to cause the apparatus to:

select randomly the first state or the second state for writing the first state or the second state at the memory cell as part of precharging the memory cell.

24. The apparatus of claim 19, wherein the controller is further operable to cause the apparatus to:

write, during the first phase of the access operation cycle and as part of activating the memory cell, the second state at the memory cell.

25. The apparatus of claim 19, wherein each memory cell of the plurality of memory cells comprises a ferroelectric capacitor configured to store a charge corresponding to the first state or the second state.

* * * * *